(12) United States Patent
Li

(10) Patent No.: US 11,411,071 B1
(45) Date of Patent: Aug. 9, 2022

(54) CAPACITOR ARRAY STRUCTURE AND METHOD FOR MANUFACTURING A CAPACITOR ARRAY STRUCTURE, AND SEMICONDUCTOR MEMORY DEVICE

(71) Applicant: CHANGXIN MEMORY TECHNOLOGIES, INC., Hefei (CN)

(72) Inventor: Xiusheng Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/599,464

(22) PCT Filed: Jun. 30, 2021

(86) PCT No.: PCT/CN2021/103744
§ 371 (c)(1),
(2) Date: Sep. 28, 2021

(87) PCT Pub. No.: WO2022/062545
PCT Pub. Date: Mar. 31, 2022

(30) Foreign Application Priority Data

Sep. 28, 2020 (CN) .......................... 202011068522.7

(51) Int. Cl.
*H01L 27/108* (2006.01)
*H01L 49/02* (2006.01)
(52) U.S. Cl.
CPC ........ *H01L 28/75* (2013.01); *H01L 27/10808* (2013.01); *H01L 27/10855* (2013.01); *H01L 28/91* (2013.01)
(58) Field of Classification Search
CPC ......... H01L 28/40; H01L 28/60; H01L 28/75; H01L 23/5223; H01L 27/0733;
(Continued)

(56) References Cited

U.S. PATENT DOCUMENTS 8,629,426 B2    1/2014  Lin et al.
9,627,502 B2    4/2017  Wilhelm
(Continued)

FOREIGN PATENT DOCUMENTS

CN    101101922 A    1/2008
CN    102487073 A    6/2012
(Continued)

OTHER PUBLICATIONS

International Search Report cited in PCT/CN2021/103744 dated Sep. 8, 2021, 10 pages.

*Primary Examiner* — Thanhha S Pham
(74) *Attorney, Agent, or Firm* — Cooper Legal Group, LLC

(57) ABSTRACT

The embodiments of the present disclosure provide a method for manufacturing a capacitor array structure, a capacitor array structure and a semiconductor memory device. The method for manufacturing a capacitor array structure includes: providing a substrate; forming a capacitor structure on the substrate; wherein the capacitor structure includes a bottom electrode layer formed on the substrate, a capacitor dielectric layer formed on a surface of the bottom electrode layer, and a top electrode layer formed on a surface of the capacitor dielectric layer; and there is gaps formed by the top electrode layer; forming a filling layer to fill the gaps; forming a covering layer to cover the filling layer and the top electrode layer; wherein, the covering layer is combined with the filling layer to define a top electrode conductive layer.

18 Claims, 4 Drawing Sheets

(58) Field of Classification Search
CPC ........... H01L 27/0805; H01L 27/10855; H01L 27/10852; H01L 27/10847; H01L 27/10808
See application file for complete search history.

(56) References Cited

U.S. PATENT DOCUMENTS

| | | |
|---|---|---|
| 11,075,204 B2 | 7/2021 | Kim et al. |
| 2005/0064660 A1 | 3/2005 | Oh et al. |
| 2006/0097299 A1* | 5/2006 | Ahn ........................ H01L 28/60 257/295 |

FOREIGN PATENT DOCUMENTS

| | | |
|---|---|---|
| CN | 105374684 A | 3/2016 |
| CN | 105428356 A | 3/2016 |
| CN | 107910327 A | 4/2018 |
| CN | 107968044 A | 4/2018 |
| CN | 108155152 A | 6/2018 |
| CN | 111326513 A | 6/2020 |

* cited by examiner

CAPACITOR ARRAY STRUCTURE AND METHOD FOR MANUFACTURING A CAPACITOR ARRAY STRUCTURE, AND SEMICONDUCTOR MEMORY DEVICE

CROSS-REFERENCE TO RELATED APPLICATIONS

The present application is a national stage of International Patent Application No. PCT/CN2021/103744, filed on Jun. 30, 2021, which claims priority to Chinese patent application No. 202011068522.7, titled "Capacitor Array Structure and Method for Manufacturing a Capacitor Array Structure, and Semiconductor Memory Device", filed on Sep. 28, 2020. The entire contents of International Patent Application No. PCT/CN2021/103744 and Chinese patent application No. 202011068522.7 are incorporated herein by reference.

TECHNICAL FIELD

The present disclosure relates to semiconductor technology, and specifically to, a method for manufacturing a capacitor array structure, a capacitor array structure, and a semiconductor memory device.

BACKGROUND

A dynamic random access memory (DRAM) is a semiconductor memory device commonly used in computers, and DRAM is composed of many repetitive storage units. In the manufacturing process of DRAM below 20 nm, DRAM mostly adopts a stacked capacitor structure, wherein the capacitor is column-shaped with a high depth-to-width ratio.

Wherein, when the layer for electric conduction on the top electrode fills the gaps formed by the top electrode, since the gaps have a high depth-to-width ratio, sealing in advance can occur when a material is filled in the gaps, so that a seam is generated in the capacitor structure, increasing the leakage current of the device and the power consumption of the device, and even causing the device to fail.

It is noted, the information disclosed in the above background section is intended to enhance the understanding of the background of the present disclosure only, and therefore may contain information that does not form the prior art that is already known to those ordinarily skilled in the art.

SUMMARY

The embodiments of the present disclosure provide a method for manufacturing a capacitor array structure, a capacitor array structure and a semiconductor memory device.

According to the first aspect, the embodiments of the present disclosure provide a method for manufacturing a capacitor array structure, the method for manufacturing a capacitor array structure comprises: providing a substrate; forming a capacitor structure on the substrate; wherein the capacitor structure comprises a bottom electrode layer formed on the substrate, a capacitor dielectric layer formed on a surface of the bottom electrode layer, and a top electrode layer formed on a surface of the capacitor dielectric layer; and there is gaps formed by the top electrode layer; forming a filling layer to fill the gaps; forming a covering layer to cover the filling layer and the top electrode layer; wherein, the covering layer is combined with the filling layer to define a top electrode conductive layer; a material of both of the filling layer and the covering layer comprises doped polycrystalline silicon; and a volume concentration of doped germanium atoms in the covering layer is greater than a volume concentration of doped germanium atoms in the filling layer.

According to the second aspect, the embodiments of the present disclosure provide a capacitor array structure, the capacitor array structure comprises: a substrate; a capacitor structure, arranged on the substrate; wherein the capacitor structure comprises a bottom electrode layer, a capacitor dielectric layer and a top electrode layer; the capacitor dielectric layer covers a surface of the bottom electrode layer; the top electrode layer covers a surface of the capacitor dielectric layer; and there is gaps formed by the top electrode layer; an top electrode conductive layer comprising a filling layer and a covering layer; wherein the filling layer fills the gaps, the covering layer covers the filling layer and the top electrode layer; a material of both of the covering layer and the filling layer comprises doped polycrystalline silicon; and a volume concentration of doped germanium atoms in the covering layer is greater than a volume concentration of doped germanium atoms in the filling layer.

According to the third aspect, the embodiments of the present disclosure provide a semiconductor memory device, the semiconductor memory device comprises a capacitor array structure above; wherein, the substrate further comprises a transistor; and the capacitor structure is electrically connected to the transistor.

It should be understood that both the above general description and the following detailed description are exemplary and explanatory only, and are not restrictive of the present disclosure.

BRIEF DESCRIPTION OF THE DRAWINGS

The accompanying drawings incorporated into the description and constituting a part of the description illustrate the embodiments of the present disclosure, and are used together with the description to explain the principles of the embodiments of the present disclosure. Obviously, the drawings in the following description are some embodiments of the present disclosure, but not all embodiments. For those of ordinary skill in the art, other drawings may be obtained based on these drawings without any creative efforts.

DETAILED DESCRIPTION

Figure 1:
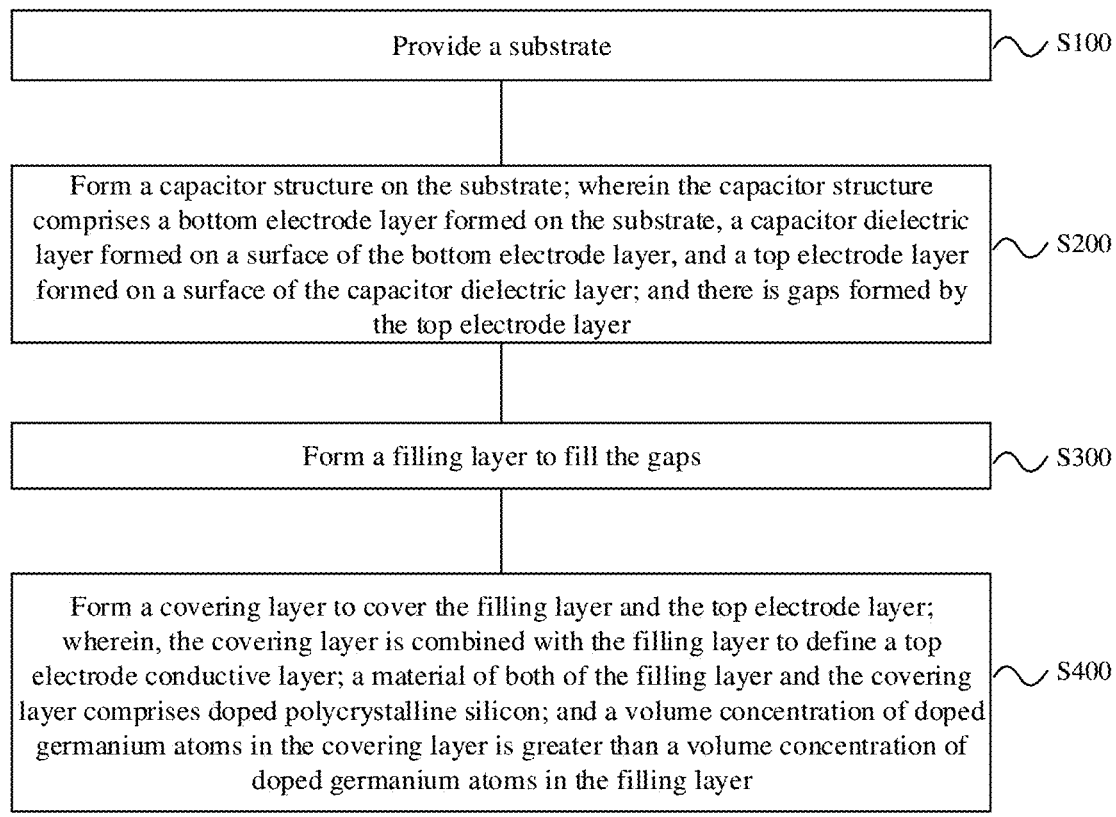
FIG. 1 is a flowchart of a method for manufacturing a capacitor array structure according to an embodiment of the present disclosure.

Exemplary embodiments will now be described more fully with reference to the accompanying drawings. However, the exemplary embodiments could be implemented in many forms, and should not be construed as being limited to the embodiments set forth herein; on the contrary, these embodiments are provided in a way that makes the present disclosure more thorough and complete, and fully conveys the ideas of the exemplary embodiments to those skilled in the art.

Furthermore, the described features, structures, or characteristics may be combined in any suitable manner in one or more embodiments. In the following description, numerous specific details are set forth in order to provide a thorough understanding of the embodiments of the present disclosure. However, those skilled in the art will realize that the technical solution of the present disclosure may be practiced without one or more of the specific details, or with other methods, devices, and steps, etc. In other cases, publicly known methods, devices, implementations, or operations are not shown or described in detail to avoid obscuring all aspects of the present disclosure.

The flowcharts shown in the drawings are merely illustrative. Neither do they have to include all contents and steps nor do they have to be performed in the order described. For example, some steps may be broken down, and some may be combined or partially combined, so the actually applied order may be changed as the case may be. The terms "a," "an," and "the" are used to indicate the presence of one or more elements/components, etc. The terms "comprising", "including", and "having" are intended to be inclusive and mean that there may be additional elements/components, etc. besides those listed.

An embodiment of the present disclosure provides a method for manufacturing a capacitor array structure, as shown in FIG. 1, the method for manufacturing a capacitor array structure comprises:

Step S100: providing a substrate;

Step S200: forming a capacitor structure on the substrate; wherein the capacitor structure includes a bottom electrode layer formed on the substrate, a capacitor dielectric layer formed on a surface of the bottom electrode layer, and a top electrode layer formed on a surface of the capacitor dielectric layer; and there is gaps formed by the top electrode layer;

Step S300: forming a filling layer to fill the gaps;

Step S400: forming a covering layer to cover the filling layer and the top electrode layer;

wherein the covering layer is combined with the filling layer to define a top electrode conductive layer; the material of both of the filling layer and the covering layer includes doped polycrystalline silicon; and the volume concentration of doped germanium atoms in the covering layer is greater than the volume concentration of doped germanium atoms in the filling layer.

According to the method for manufacturing a capacitor array structure provided in the embodiments of the present disclosure, the top electrode conductive layer is formed by combining the filling layer and the covering layer, and the volume concentration of germanium atoms in the covering layer is greater than that of germanium atoms in the filling layer, so that the volume concentration of germanium atoms in the filling layer is relatively small, and the particle size of filling molecules is relatively reduced, so that the gaps can be filled more compactly; in the meanwhile, the volume concentration of germanium atoms in the covering layer is higher, so that the structural resistance can be balanced, and the performance of the top electrode conductive layer is ensured. By reducing the seam that appears when the top electrode conductive layer fills the gaps, the leakage current of the capacitor is reduced, and the performance of the capacitor is improved.

Now, each step of the method for manufacturing a capacitor array structure in this exemplary embodiment will be further described.

In Step S100, a substrate is provided.

Figure 2:
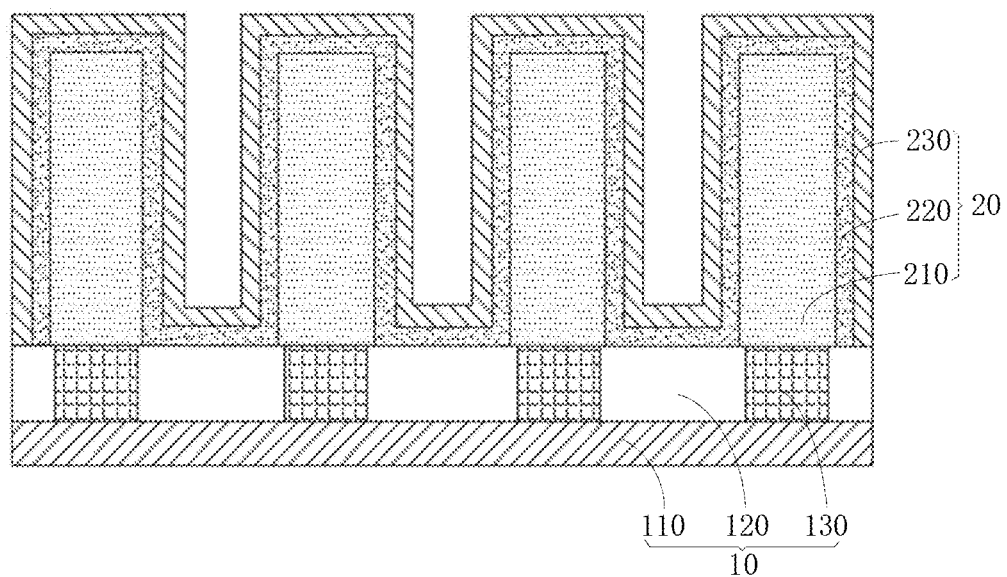
FIG. 2 to FIG. 4 are manufacturing process diagrams of the capacitor array structure according to an embodiment of the present disclosure.

In some embodiments, as shown in FIG. 2, the substrate 10 comprises an underlayer 110 and an insulating layer 120, and a plurality of storage node contact plugs 130 at interval are arranged in the insulating layer 120. Wherein, the underlayer 110 may be a semiconductor underlayer 110, and the material of the semiconductor underlayer 110 may be silicon (Si), germanium (Ge), silicon germanium (GeSi), and silicon carbide (SiC), etc., which is not limited in the present disclosure.

Wherein, the contact plugs 130 are used to connect the bottom electrode layer 210 of the capacitor formed subsequently, and data stored in a capacitor can be read or date can be written into a capacitor by the contact plugs 130. The arrangement of the multiple contact plugs 130 is same as that of the capacitor holes subsequently formed. In an embodiment, the multiple contact plugs 130 may be arranged in a hexagonal array. Wherein, the contact plugs 130 are made of a metal, which may be W (tungsten), Cu (copper), Ti (titanium), Ni (nickel) or Al (aluminum), or metal silicide. The contact plugs 130 may be formed by depositing and then etching a conducting layer, or by an electroplating process.

Wherein, the material of the insulating layer 120 may be silicon oxide, silicon nitride, or any other suitable material, and the material of the insulating layer 120 may be a single-layer or multi-layer stacked structure. In an embodiment, the insulating layer 120 is formed as follows: an insulating material layer is formed on the semiconductor underlayer 110 by deposition process, and the insulating material layer covers the contact plugs 130, wherein the deposition process can be chemical vapor deposition, plasma enhanced chemical vapor deposition or low pressure chemical vapor deposition; the insulating material layer on the surface of the contact plugs 130 is removed by flattening process to form the insulating layer 120, wherein the flattening process may be a chemical mechanical grinding process.

In Step S200, a capacitor structure is formed on the substrate, the capacitor structure includes a bottom electrode layer formed on the substrate, a capacitor dielectric layer formed on the surface of the bottom electrode layer, and a top electrode layer formed on the surface of the capacitor dielectric layer, and there is gaps formed by the top electrode layer.

In some embodiments, as shown in FIG. 2, a capacitor structure 20 is formed on the substrate; the capacitor structure includes a bottom electrode layer 210 formed on the substrate 10, a capacitor dielectric layer 220 formed on the surface of the bottom electrode layer 210, and a top electrode layer 230 formed on the surface of the capacitor dielectric layer 220.

Wherein, a bottom electrode layer 210 comprising a plurality of pillar-shaped electrodes is formed by atomic layer deposition or chemical vapor deposition or physical vapor deposition. Wherein, the material of the bottom electrode layer 210 may include one of tungsten, titanium, nickel, aluminum, platinum, titanium nitride, N-type polysilicon, P-type polysilicon, or a stack of two or more of the above materials; and the material of the bottom electrode layer may further include a metal nitride or a metal silicide, or a compound of metal nitride and metal silicide, such as titanium nitride, titanium silicide, nickel silicide, and titanium silicon nitride ($TiSi_xN_y$). In an embodiment, the material of the bottom electrode layer 210 is same as the material of the contact plugs 130, so that the bottom electrode formed by the bottom electrode layer 210 and the contact plugs 130 has good electrical properties.

Wherein, a capacitor dielectric layer 220 covering the bottom electrode layer 210 may be formed by atomic layer deposition, chemical vapor deposition, or physical vapor deposition, and the capacitor dielectric layer 220 simultaneously covers the surface of the substrate 10 exposed from a plurality of columnar electrodes. When there is no other film layer between the capacitor dielectric layer 220 and the bottom electrode layer 210, the capacitor dielectric layer 220 may directly cover the surface of the bottom electrode layer 210; when any other film layer is involved between the capacitor dielectric layer 220 and the bottom electrode layer 210, the dielectric layer is not in direct contact with the bottom electrode layer 210, but covers the bottom electrode layer 210 relatively. Wherein, the capacitor dielectric layer 220 may be a single-layer or multi-layer stacked structure, and the capacitor dielectric layer 220 may be one of a stacked structure composed of strontium titanate and titanium oxide ($SrTiO_3/TiO_2$), a stacked structure composed of aluminum oxide and hafnium oxide (AlO/HfO), a stacked structure composed of zirconium oxide and aluminum oxide (ZrO/AlO/ZrO), and a composite perovskite-type ferroelectric material (a BST material, a ferroelectric material with a composite perovskite structure, a solid solution composed of $BaTiO_3$ and $SrTiO_3$ at a certain ratio); the capacitor dielectric layer may also be formed using silicon oxide, silicon nitride, silicon oxynitride, FSG (fluorine doped silicon dioxide), BSG (boron doped silicon dioxide), PSG (phosphorus doped silicon dioxide), or BPSG (boron phosphorus doped silicon dioxide), or a combination thereof. The dielectric constant of the capacitor dielectric layer 220 is between 4 and 400, and the capacitor dielectric layer 220 is preferably made of a high-K dielectric material to increase the capacitance per unit area of the capacitor.

Wherein, a top electrode layer 230 comprising a plurality of columnar electrodes is formed by atomic layer deposition or chemical vapor deposition or physical vapor deposition. Wherein, the material that forms the top electrode layer 230 may include one of tungsten, titanium, nickel, aluminum, platinum, titanium nitride, N-type polysilicon, P-type polysilicon, or a stack of two or more of the above materials, and may further include a metal nitride or a metal silicide, or a compound of metal nitride and metal silicide, such as titanium nitride, titanium silicide, nickel silicide and titanium silicon nitride ($TiSi_xN_y$). In an embodiment, the material of the top electrode layer 230 is same as the material of the bottom electrode layer 210 to reduce process difficulty and improve process efficiency.

As shown in FIG. 2, after the top electrode layer 230 covers the capacitor dielectric layer 220, there is gaps formed by the top electrode layer 230 of adjacent columnar electrodes, and the gaps have a large depth-to-width ratio (20:1-100:1); for example, the height may be 1000 nm-2000 nm, and the CD (critical dimension) may be 30 nm-60 nm. In the conventional method, when the gaps of the top electrode layer are filled, sealing in advance would occur, which forms seams in the top electrode conductive layer, and increases the leakage current of the capacitor array structure.

In Step S300, a filling layer is formed to fill the gaps.

Figure 3:
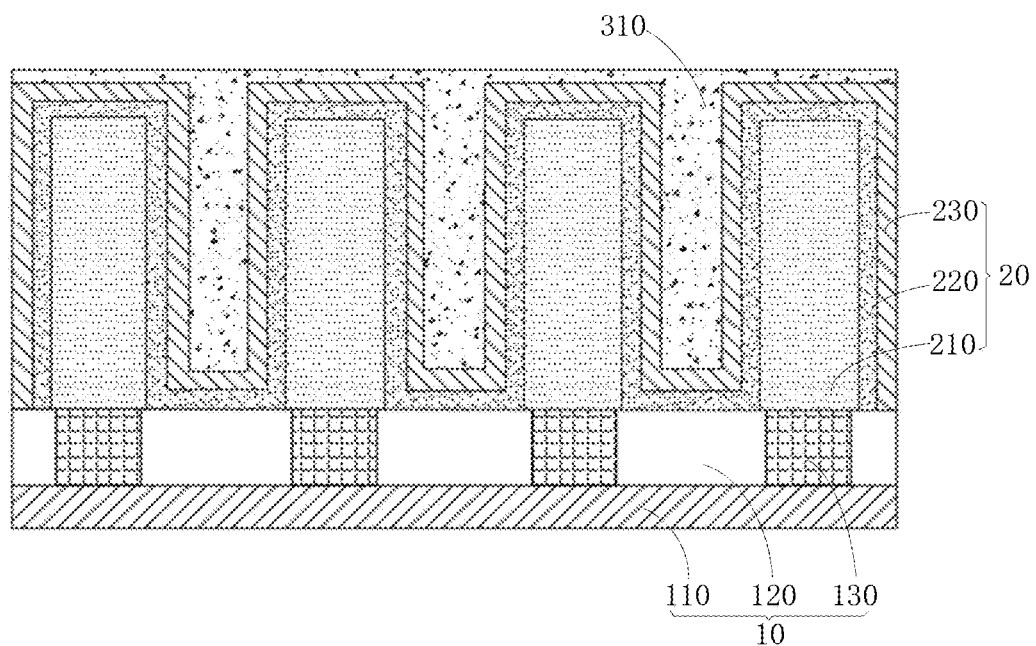
Figure 7:
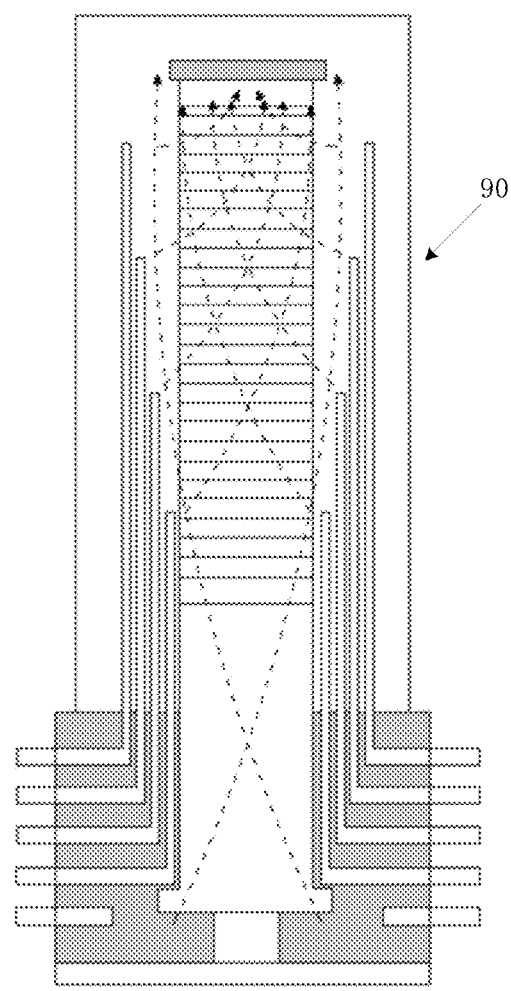
FIG. 7 is a schematic diagram of the reaction chamber according to an embodiment of the present disclosure.

In some embodiments, as shown in FIG. 3 and FIG. 7, a filling layer 310 filling the gaps may be formed by chemical vapor deposition in the reaction chamber 90. The material of the filling layer 310 includes germanium-doped polysilicon doped with germanium atoms, and $SiH_4$ gas and $GeH_4$ gas are introduced by a nozzle. The chemical reaction of $SiH_4$ gas and $GeH_4$ gas in the reaction chamber 90 is as follows:

$$SiH_4 (g) \rightarrow Si (s) + 2H_2 (g)$$

$$GeH_4 (g) \rightarrow Ge (s) + 2H_2 (g)$$

When $SiH_4$ gas and $GeH_4$ gas are introduced into the reaction chamber 90, Si atoms and Ge atoms are generated by chemical reaction, and Si atoms and Ge atoms are deposited in the gaps to form a filling layer 310 with germanium-doped polysilicon.

Wherein, when the filling layer 310 is deposited by chemical vapor deposition in the reaction chamber 90, $SiH_4$ gas is introduced at a flow rate of 300 sccm-700 sccm and $GeH_4$ gas is introduced at a flow rate of 850 sccm-1300 sccm. When the flow rate of $GeH_4$ gas is set to the above standard milliliters/minute, a good deposition effect of the deposition material can be ensured, and the seams in the filling layer 310 is further reduced. Of course, the flow rates of $SiH_4$ gas and $GeH_4$ gas may be out of the above ranges, and which are not restricted by the present disclosure.

Wherein, the duration time of introducing $SiH_4$ gas and $GeH_4$ gas into the reaction chamber 90 is 20 min-50 min, such as 20 min, 30 min, 40 min, or 50 min. Of course; the deposition time may be greater than 20 min or less than 50 min, the specific deposition time can be set according to the actual situation of gaps filling, and which is not restricted by the present disclosure.

For example, the material of the filling layer 310 may be germanium-boron co-doped polysilicon, and $SiH_4$ gas, $GeH_4$ gas, and $BCl_3$ gas may be simultaneously introduced by a nozzle, wherein the chemical reaction of $BCl_3$ gas in the reaction chamber 90 is as follows:

$$2BCl_3 (g) \rightarrow 2B (s) + 3Cl_2 (g)$$

When $SiH_4$ gas, $GeH_4$ gas, and $BCl_3$ gas are introduced into the reaction chamber 90, Si atoms, B atoms, and Ge atoms are generated by chemical reaction and deposited the gaps of the filling layer 310, to fill the gaps. Wherein, when the filling layer 310 is deposited by chemical vapor deposition in the reaction chamber 90, the flow rate of $BCl_3$ gas introduced is 500 sccm-200 sccm. Of course, the gas flow rate of $BCl_3$ may be out of the above range, and which is not restricted by the present disclosure. Wherein, the duration time for introducing $BCl_3$ gas into the reaction chamber 90 is 20 min-50 min, such as 20 min, 30 min, 40 min, or 50 min. Of course, the deposition time may be greater than 20 min or less than 50 min, the specific deposition time can be set according to the actual situation of gaps filling, and which is not restricted by the present disclosure. Wherein, the duration times for introducing $SiH_4$ gas, $GeH_4$ gas, and $BCl_3$ gas can be same, so that the uniformity of deposition of various atoms in germanium-boron co-doped polycrystalline silicon is improved, and the conductivity of the top electrode conductive layer is improved.

Figure 5:
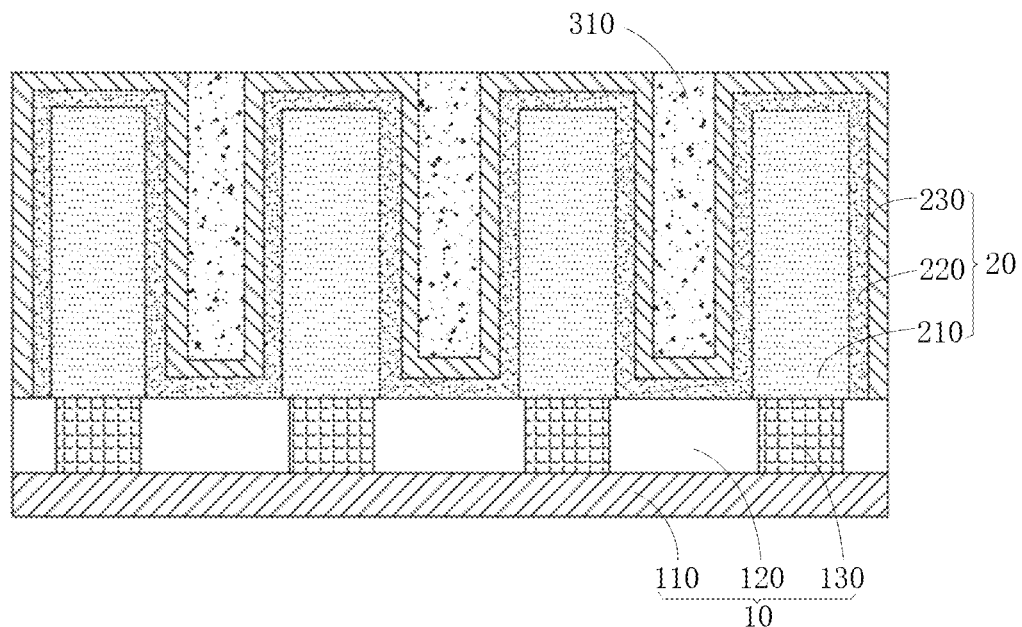
FIG. 5 and FIG. 6 are manufacturing process diagrams of the capacitor array structure according to another embodiment of the present disclosure.

As shown in FIG. 3, the depth-to-width ratio of the gaps is 20:1-100:1, the filling layer 310 completely fills the gaps, and a filling layer 310 at a certain thickness is also formed on one side surface of the top electrode layer 230 away from the substrate 10. As shown in FIG. 5, the filling layer 310 only completely fills the gaps, and the material of the filling layer 310 is not formed on the surface of one side of the top electrode layer 230 away from the substrate 10, in order to expose the surface of one side of the top electrode layer 230 which is far away from the substrate 10, and the covering layer 320 is also exposed. The volume concentration of germanium atoms in the covering layer 320 is greater than the volume concentration of the germanium atoms in the filling layer 310, and the conductive layer is good, so that the conductivity of the top electrode conductive layer 30 can be improved. Of course, the filling layer 310 may also partially fill the gaps, which is not restricted by the present disclosure.

Wherein, during chemical vapor deposition, the temperature in the reaction chamber 90 is 300° C.-600° C., such as 300° C., 400° C., 500° C., and 600° C. Of course, during chemical vapor deposition, the temperature in the reaction chamber 90 may also be less than 300° C. or greater than 600° C., and which is not restricted by the present disclosure. Wherein, during chemical vapor deposition, the pressure in the reaction chamber 90 is 100 mtorr-600 mtorr, such as 100 mtorr, 200 mtorr, 300 mtorr, 400 mtorr, 500 mtorr, or 600 mtorr. Of course, during chemical vapor deposition, the pressure in the reaction chamber 90 may also be less than 100 mtorr or greater than 600 mtorr, and which is not restricted by the present disclosure.

By using the filling layer 310 with a relatively low volume concentration of germanium atoms, the particle size of the filling material is relatively reduced, so that the gaps can be filled more compactly, the size of the seams formed is reduced when germanium-boron co-doped polycrystalline silicon is filled in the gaps, the leakage current of the capacitor is reduced, and the performance of the capacitor is improved.

In Step S400, a covering layer is formed to cover the filling layer and the top electrode layer; wherein, the covering layer is combined with the filling layer to form a top electrode conductive layer; the material of both of the filling layer and the covering layer includes doped polycrystalline silicon, and the volume concentration of doped germanium atoms in the covering layer is greater than the volume concentration of doped germanium atoms in the filling layer.

Figure 4:
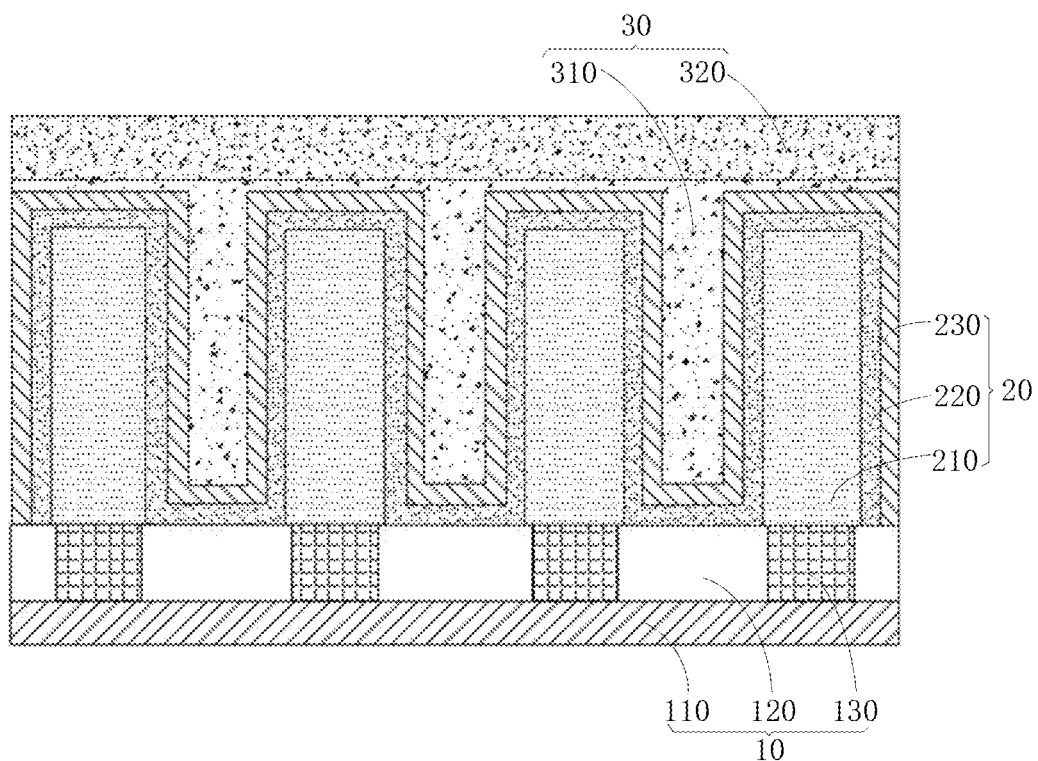
Figure 6:
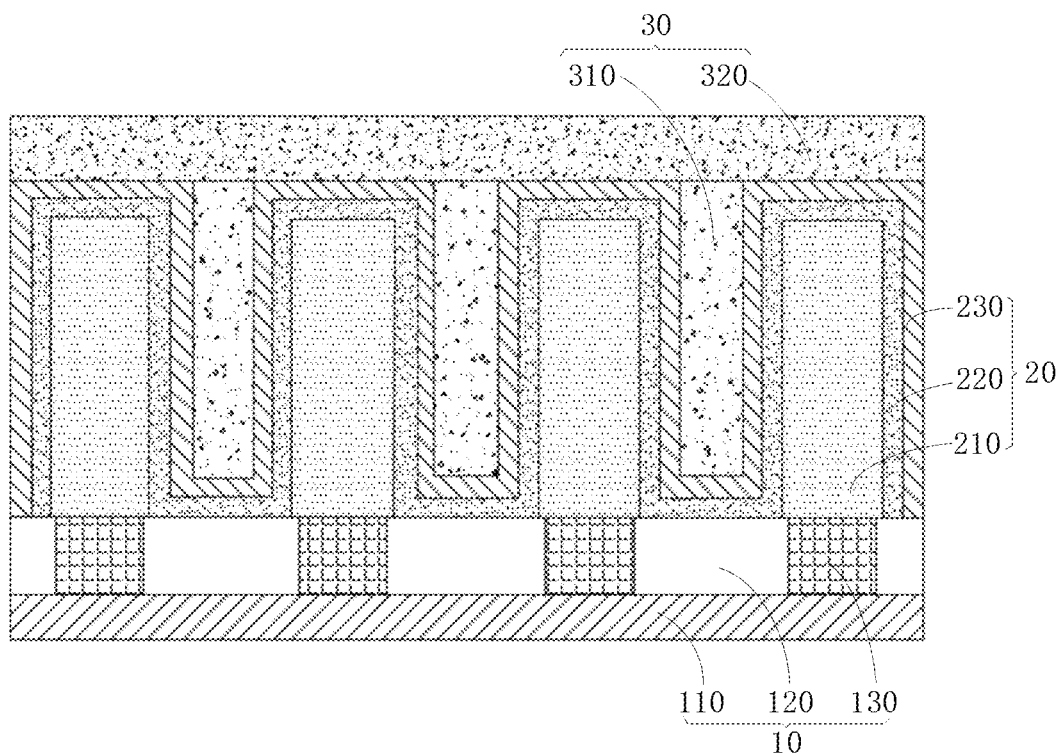

In some embodiments, as shown in FIG. 4, FIG. 6 and FIG. 7, a covering layer 320 covering both of the filling layer 310 and the top electrode layer 230 may be formed in the reaction chamber 90 by chemical vapor deposition; the covering layer 320 and the filling layer 310 may be formed in the same reaction chamber 90 to reduce process difficulty and improve process efficiency. The material of the covering layer 320 includes germanium-doped polysilicon doped with germanium atoms, and $SiH_4$ gas and $GeH_4$ gas are introduced by a nozzle. The chemical reaction of the $SiH_4$ gas and $GeH_4$ gas in the reaction chamber 90 is as follows:

$SiH_4$ (g)→Si (s)+2$H_2$ (g)

$GeH_4$ (g)→Ge (s)+2$H_2$ (g)

When $SiH_4$ gas and $GeH_4$ gas have been introduced into the reaction chamber 90, and Si atoms and Ge atoms are generated by chemical reaction, and Si atoms and Ge atoms are deposited in the gaps to form a covering layer 320 of germanium-doped polysilicon.

Wherein, when the covering layer 320 is deposited by chemical vapor deposition in the reaction chamber 90, $SiH_4$ gas is introduced at a flow rate of 300 sccm-700 sccm, and $GeH_4$ gas is introduced at a flow rate of 1250 sccm-1800 sccm; when the flow rate of $GeH_4$ gas is set to the above standard milliliters/minute, the volume concentration of germanium atoms can be ensured, and the covering layer 320 formed has excellent conductivity. Of course, the flow rates of $SiH_4$ gas and $GeH_4$ gas may be out of the above ranges, and which are not restricted by the present disclosure.

Wherein, the duration time of introducing $SiH_4$ gas and $GeH_4$ gas into the reaction chamber 90 is 120 min-180 min, such as 120 min, 130 min, 140 min, 150 min, 160 min, 170 min, or 180 min. Of course, the deposition time may also be less than 120 min or greater than 180 min, to be set based on the actual thickness of the covering layer 320, etc., and which is not restricted by the present disclosure.

For example, the material of the covering layer 320 may be germanium-boron co-doped polysilicon, and $SiH_4$ gas, $GeH_4$ gas and $BCl_3$ gas may be simultaneously introduced by a nozzle, wherein the chemical reaction of $BCl_3$ gas in the reaction chamber 90 is as follows:

$2BCl_3$ (g)→2B (s)+$3Cl_2$ (g)

When $SiH_4$ gas, $GeH_4$ gas and $BCl_3$ gas are introduced into the reaction chamber 90, Si atoms, B atoms and Ge atoms are generated by chemical reaction and deposited on the filling layer and the top electrode layer to form a covering layer 320 of Ge—B co-doped polysilicon, so that the filling layer 310 and the top electrode layer 230 are covered. When the covering layer 320 is deposited by chemical vapor deposition in the reaction chamber 90, the flow rate of $BCl_3$ gas introduced is 500 sccm-200 sccm. Of course, the gas flow rate of $BCl_3$ may be out of the above range, and which is not restricted by the present disclosure. The duration time of introducing $BCl_3$ gas into the reaction chamber 90 is 120 min-180 min, such as 120 min, 130 min, 140 min, 150 min, 160 min, 170 min, or 180 min. Of course, the deposition time may also be shorter than 120 min or greater than 180 min, to be set based on the actual thickness of the covering layer 320, etc., and which is not restricted by the present disclosure. Wherein, the times for introducing $SiH_4$ gas, the $GeH_4$ gas and the $BCl_3$ gas can be the same, so that the uniformity of deposition of various atoms in germanium-boron co-doped polycrystalline silicon is improved, and the conductivity of the top electrode conductive layer is improved.

Wherein, during chemical vapor deposition, the temperature in the reaction chamber 90 is 300° C.-600° C., such as 300° C., 400° C., 500° C., and 600° C. Of course, during chemical vapor deposition, the temperature in the reaction chamber 90 may also be less than 300° C. or greater than 600° C., and which is not restricted by the present disclosure. Wherein, during chemical vapor deposition, the pressure in the reaction chamber 90 is 100 mtorr-600 mtorr, such as 100 mtorr, 200 mtorr, 300 mtorr, 400 mtorr, 500 mtorr, or 600 mtorr. Of course, during chemical vapor deposition, the pressure in the reaction chamber 90 may also be less than 100 mtorr or greater than 600 mtorr, and which is not restricted by the present disclosure.

In the reaction chamber 90, the temperature and the pressure during forming the covering layer 320 are respectively same as the temperature and the pressure during forming the filling layer 310, which can reduce process difficulty and improve process efficiency. Of course, in the reaction chamber 90, the temperature and the pressure during forming the covering layer 320 may be same as or be different to the temperature and the pressure during forming the filling layer 310, and which are not restricted by the present disclosure.

The volume concentration of germanium atoms in the covering layer 320 is greater than 30%-50% of that of the germanium atoms in the filling layer 310. When the volume concentration of germanium atoms in the covering layer 320 is greater than that of the germanium atoms in the filling layer 310, the resistance of the covering layer 320 is low, and the covering layer 320 located outside the gaps has good conductivity, so that the conductivity of the top electrode conductive layer 30 can be improved and the situation that the conductivity of the top electrode conductive layer 30 is affected due to the low volume concentration of germanium atoms in the filling layer 310 is avoided.

The device embodiments of the present disclosure are as follow, The device embodiments may be manufactured by the method embodiments described above. Please refer to the relevant discussion of the method embodiments for details not disclosed in the device embodiment.

The embodiments of the present disclosure also provide a capacitor array structure, as shown in FIG. 2 to FIG. 6. The capacitor array structure comprises a substrate 10, a capacitor structure 20, and a top electrode conductive layer 30. The capacitor structure 20 is arranged on the substrate 10, and the capacitor structure 20 comprises a bottom electrode layer 210, a capacitor dielectric layer 220 and a top electrode layer 230. The capacitor dielectric layer 220 covers the surface of the bottom electrode layer 210, the top electrode layer 230 covers the surface of the capacitor dielectric layer 220, and there is gaps formed in the top electrode layer 230. The top electrode conductive layer 30 comprises a filling layer 310 and a covering layer 320; the filling layer 310 fills the gaps, the covering layer 320 covers the filling layer 310 and the top electrode layer 230; the material of the covering layer 320 and the filling layer 310 includes doped polysilicon; and the volume concentration of germanium atoms doped in the covering layer 320 is greater than that of germanium atoms doped in the filling layer 310.

In the capacitor array structure provided in the present disclosure, the top electrode conductive layer 30 is formed by combining the filling layer 310 and the covering layer 320, and the volume concentration of the germanium atoms in the covering layer 320 is greater than that of germanium atoms in the filling layer 310, so that the volume concentration of germanium atoms in the filling layer 310 is relatively low, and the particle size of filling molecules is relatively reduced, so that the gaps can be filled more concentrated. In the meanwhile, when the volume concentration of the germanium atoms in the covering layer 320 is higher, the resistance of the structural can be balanced, and the performance of the top electrode conductive layer 30 is ensured. By reducing the seam that appears when the top electrode conductive layer 30 fills the gaps, the leakage current of the capacitor is reduced, and the performance of the capacitor is improved.

In some embodiments, as shown in FIG. 3 and FIG. 7, a filling layer 310 filling the gaps may be formed by chemical vapor deposition in the reaction chamber 90.

The material of the filling layer 310 includes germanium-doped polysilicon doped with germanium atoms, and SiH$_4$ gas and GeH$_4$ gas are introduced by a nozzle. The chemical reaction of SiH$_4$ gas and GeH$_4$ gas introduced in the reaction chamber 90 is as follows:

SiH$_4$ (g)→Si (s)+2H$_2$ (g)

GeH$_4$ (g)→Ge (s)+2H$_2$ (g)

For example, the material of the filling layer 310 may be germanium-boron co-doped polysilicon, and SiH$_4$ gas, GeH$_4$ gas, and BCl$_3$ gas may be simultaneously introduced by a nozzle, wherein the chemical reaction of BCl$_3$ gas in the reaction chamber 90 is as follows:

2BCl$_3$ (g)→2B (s)+3Cl$_2$ (g)

SiH$_4$ gas, GeH$_4$ gas, and BCl$_3$ gas are introduced in the reaction chamber 90, Si atoms, B atoms, and Ge atoms are generated by a chemical reaction, and Si atoms, B atoms, and Ge atoms are deposited on the filling layer 310 in the gaps to fill the gaps.

When the filling layer 310 is deposited by chemical vapor deposition in the reaction chamber 90, SiH$_4$ gas is introduced at a flow rate of 300 sccm-700 sccm, GeH$_4$ gas is introduced at a flow rate of 850 sccm-1300 sccm, and BCl$_3$ gas is introduced at a flow rate of 500 sccm-200 sccm. When the flow rates of SiH$_4$ gas, GeH$_4$ gas, and BCl$_3$ gas are set to the above standard milliliters/minute, a good deposition effect of the deposition material can be ensured, and the seam in the filling layer 310 is further reduced. Of course, the flow rates of SiH$_4$ gas, the GeH$_4$ gas and the BCl$_3$ gas may be out of the above ranges, and which are not restricted by the present disclosure. The volume concentration of germanium atoms in the filling layer 310 is 45%-80%, such as 45%, 50%, 55%, 65%, 70%, 75%, or 80%.

As shown in FIG. 3, the filling layer 310 completely fills the gaps, and a filling layer 310 at a certain thickness is also formed on the surface of one side of the top electrode layer 230 away from the substrate 10. As shown in FIG. 5, the filling layer 310 only completely fills the gaps, and the material of the filling layer 310 is not formed on the surface of one side of the top electrode layer 230 away from the substrate 10, in order to expose the surface of one side of the top electrode layer 230 away from the substrate 10 and the covering layer 320. The volume concentration of germanium atoms in the covering layer 320 is greater than that of the germanium atoms in the filling layer 310, and the conductive layer is good, so that the conductivity of the top electrode conductive layer 30 can be improved. Of course, the filling layer 310 may also partially fill the gaps, which is not restricted by the present disclosure.

Wherein, during chemical vapor deposition, the temperature in the reaction chamber 90 is 300° C.-600° C., such as 300° C., 400° C., 500° C., and 600° C. Of course, during chemical vapor deposition, the temperature in the reaction chamber 90 may also be less than 300° C. or greater than 600° C., and which is not restricted by the present disclosure. Wherein, during chemical vapor deposition, the pressure in the reaction chamber 90 is 100 mtorr-600 mtorr, such as 100 mtorr, 200 mtorr, 300 mtorr, 400 mtorr, 500 mtorr, or 600 mtorr. Of course, during chemical vapor deposition, the pressure in the reaction chamber 90 may also be less than 100 mtorr or greater than 600 mtorr, and which is not restricted by the present disclosure. The deposition time of the filling layer 310 in the reaction chamber 90 by chemical vapor deposition is 20 min-50 min, such as 20 min, 30 min, 40 min, or 50 min. Of course, the deposition time may be greater than 20 min or shorter than 50 min, to be set according to the actual situation of gaps filling, and which is not restricted by the present disclosure.

As shown in FIG. 4, FIG. 6, and FIG. 7, a covering layer 320 covering the filling layer 310 and the top electrode layer 230 may be formed in the reaction chamber 90 by chemical vapor deposition, and the covering layer 320 and the filling layer 310 may be formed in the same reaction chamber 90 to reduce process difficulty and improve process efficiency. SiH$_4$ gas, the GeH$_4$ gas and the BCl$_3$ gas are introduced into the reaction chamber 90, Si atoms, B atoms, and Ge atoms are generated by chemical reaction, and Si atoms, B atoms, and Ge atoms are deposited on the filling layer 310 in the gaps to cover the filling layer 310 and the top electrode layer 230.

When the filling layer 310 is deposited by chemical vapor deposition in the reaction chamber 90, SiH$_4$ gas is introduced at a flow rate of 300 sccm-700 sccm, GeH$_4$ gas is introduced at a flow rate of 1,250 sccm-1,800 sccm, and BCl$_3$ gas is introduced at a flow rate of 500 sccm-200 sccm. When the flow rates of SiH$_4$ gas, the GeH$_4$ gas and the BCl$_3$ gas are set to the above standard milliliters/minute, a good deposition effect of the deposition material can be ensured, and the seam in the filling layer 310 is further reduced. Of course, the flow rates of $SiH_4$ gas, the $GeH_4$ gas and the $BCl_3$ gas may be out of the above ranges, and which are not restricted by the present disclosure. The volume concentration of germanium atoms in the covering layer 320 is 55%-85%, such as 55%, 60%, 65%, 75%, 80%, or 85%; the volume concentration of germanium atoms in the covering layer 320 is greater than 30%-50% of that of the germanium atoms in the filling layer 310, such as 30%, 35%, 40%, 45%, or 50%.

Since the gaps has a large depth-to-width ratio (20:1-100:1), by using the filling layer 310 with a relatively low volume concentration of germanium atoms, the particle size of the filling material is relatively reduced, so that the gaps can be filled more compactly, the size of the seam that appears when germanium-boron co-doped polycrystalline silicon is filled in the gaps is reduced, the leakage current of the capacitor is reduced, and the performance of the capacitor is improved. When the volume concentration of germanium atoms in the covering layer 320 is greater than that of the germanium atoms in the filling layer 310, the resistance of the covering layer 320 is low, and the covering layer 320 located outside the gaps has good conductivity, so that the conductivity of the top electrode conductive layer 30 can be improved as a whole, and the situation that the conductivity of the top electrode conductive layer 30 is affected due to the low volume concentration of germanium atoms in the filling layer 310 is avoided.

In some embodiments, as shown in FIG. 2, the substrate 10 comprises an underlayer 110 and an insulating layer 120, and a plurality of storage node contact plugs 130 arranged alternatively are disposed in the insulating layer 120. Wherein, the underlayer 110 may be a semiconductor underlayer 110, and the material of the semiconductor underlayer 110 may be silicon (Si), germanium (Ge), silicon germanium (GeSi), and silicon carbide (SiC), etc., which is not limited in the present disclosure.

Wherein, the contact plugs 130 are used to connect the bottom electrode layer 210 of the capacitor formed subsequently, and data can be read from or written into the capacitor by the contact plugs 130. The arrangement of the multiple contact plugs 130 is same as that of the capacitor holes formed subsequently. In an embodiment, the multiple contact plugs 130 may be arranged in a hexagonal array. Wherein, the contact plugs 130 are made of a metal, which may be W (tungsten), Cu (copper), Ti (titanium), Ni (nickel) or Al (aluminum), or metal silicide. The contact plugs 130 may be formed by depositing and then etching a conducting layer, or by an electroplating process.

Wherein, the material of the insulating layer 120 may be silicon oxide, silicon nitride, or any other suitable material, and the material of the insulating layer 120 may be a single-layer or multi-layer stacked structure. In an embodiment, the insulating layer 120 is formed as follows: an insulating material layer is formed on the semiconductor underlayer 110 by deposition, and covers the contact plugs 130, wherein the deposition process can be chemical vapor deposition, plasma enhanced chemical vapor deposition or low pressure chemical vapor deposition; the insulating material layer on the surface of the contact plugs 130 is removed by flattening to form the insulating layer 120, wherein the flattening process may be a chemical mechanical grinding process.

The capacitor structure 20 comprises a bottom electrode layer 210, a capacitor dielectric layer 220 and a top electrode layer 230. The material of the bottom electrode layer 210 may include one of tungsten, titanium, nickel, aluminum, platinum, titanium nitride, N-type polysilicon, P-type polysilicon, or a stack of two or more of the above materials, and may further include a metal nitride or metal silicide, or a compound of both, such as titanium nitride, titanium silicide, nickel silicide, and titanium silicon nitride ($TiSi_xN_y$). In an embodiment, the material of the bottom electrode layer 210 is same as that of the contact plugs 130, so that the bottom electrode formed by the bottom electrode layer 210 and the contact plugs 130 has good electrical properties.

Wherein, the capacitor dielectric layer 220 may be a single-layer or multi-layer stacked structure, and the capacitor dielectric layer 220 may be one of a stacked structure composed of strontium titanate and titanium oxide ($SrTiO_3$/$TiO_2$), a stacked structure composed of aluminum oxide and hafnium oxide (AlO/HfO), a stacked structure composed of zirconium oxide and aluminum oxide (ZrO/AlO/ZrO), and a composite perovskite-type ferroelectric material (a BST material, a ferroelectric material with a composite perovskite structure, a solid solution composed of $BaTiO_3$ and $SrTiO_3$ at a certain ratio); it may also be made of a material comprising one or more of silicon oxide, silicon nitride, silicon oxynitride, FSG (fluorine doped silicon dioxide), BSG (boron doped silicon dioxide), PSG (phosphorus doped silicon dioxide), and BPSG (boron phosphorus doped silicon dioxide). The dielectric constant of the capacitor dielectric layer 220 is between 4 and 400, and the capacitor dielectric layer 220 is preferably made of a high-K dielectric material to increase the capacitance per unit area of the capacitor.

Wherein, the material of the top electrode layer 230 may include one of tungsten, titanium, nickel, aluminum, platinum, titanium nitride, N-type polysilicon, P-type polysilicon, or a stack of two or more of the above materials, and the material of the top electrode layer may further include a metal nitride or metal silicide, or a compound of both, such as titanium nitride, titanium silicide, nickel silicide and titanium silicon nitride ($TiSi_xN_y$). In an embodiment, the material of the top electrode layer 230 is same as that of the bottom electrode layer 210 to reduce process difficulty and improve process efficiency.

The embodiments of the present disclosure also provide a semiconductor memory device. The semiconductor memory device comprises the capacitor array structure above, the substrate further comprises a transistor, and the capacitor structure is electrically connected to the transistor; the capacitor array structure can be formed by the method for manufacturing a capacitor array structure. For the advantageous effects of the semiconductor memory device, reference is made to the above discussion of the capacitor array structure, which is not repeated here. As an example, the semiconductor memory device may be, but is not limited to, a dynamic random access memory (DRAM).

Those skilled in the art can easily think of other embodiments of the present disclosure when considering the specification and practicing the invention disclosed herein. The present application is intended to cover any variants, uses, or adaptations of the present disclosure following the general principles of the present disclosure and including common knowledge or customary technical means in the art not disclosed in the present disclosure. The specification and the embodiments are deemed exemplary only, and the true scope and spirit of the present disclosure are indicated by the following claims.

It should be understood that the present disclosure is not limited to the precise structures that have been described above and shown in the drawings, and that various modifications and changes may be made without departing from the scope thereof. The scope of the present disclosure is restricted by the attached claims only.

The invention claimed is:

1. A method for manufacturing a capacitor array structure, comprising:
   providing a substrate;
   forming a capacitor structure on the substrate; wherein the capacitor structure comprises a bottom electrode layer formed on the substrate, a capacitor dielectric layer formed on a surface of the bottom electrode layer, and a top electrode layer formed on a surface of the capacitor dielectric layer; and there is gaps formed by the top electrode layer;
   forming a filling layer to fill the gaps;
   forming a covering layer to cover the filling layer and the top electrode layer;
   wherein, the covering layer is combined with the filling layer to define a top electrode conductive layer; a material of both of the filling layer and the covering layer comprises doped polycrystalline silicon; and a volume concentration of doped germanium atoms in the covering layer is greater than a volume concentration of doped germanium atoms in the filling layer.

2. The method for manufacturing a capacitor array structure according to claim 1, wherein the filling layer and the covering layer are formed by chemical vapor deposition.

3. The method for manufacturing a capacitor array structure according to claim 2, wherein $GeH_4$ gas is introduced when the filling layer is formed;
   a flow rate of $GeH_4$ gas introduced is 850 sccm-1300 sccm.

4. The method for manufacturing a capacitor array structure according to claim 3, wherein a duration time of $GeH_4$ gas introduced is 20 min-50 min.

5. The method for manufacturing a capacitor array structure according to claim 2, wherein $GeH_4$ gas is introduced when the covering layer is formed;
   a flow rate of $GeH_4$ gas introduced is 1250 sccm-1800 sccm.

6. The method for manufacturing a capacitor array structure according to claim 5, wherein a duration time of $GeH_4$ gas introduced is 120 min-180 min.

7. The method for manufacturing a capacitor array structure according to claim 1, wherein a volume concentration of germanium atoms in the covering layer is greater than 30%-50% of a volume concentration of germanium atoms in the filling layer.

8. The method for manufacturing a capacitor array structure according to claim 2, wherein, during a chemical vapor deposition, a temperature is 300° C.-600° C.

9. The method for manufacturing a capacitor array structure according to claim 2, wherein, during a chemical vapor deposition, a pressure in a reaction chamber is 100 mtorr-600 mtorr.

10. The method for manufacturing a capacitor array structure according to claim 2, wherein, when the filling layer and the covering layer are formed, $GeH_4$ gas, $SiH_4$ gas, and $BCl_3$ gas are simultaneously introduced;
    a flow rate of $SiH_4$ gas introduced is 300 sccm-700 sccm, and a flow rate of $BCl_3$ gas introduced is 50 sccm-200 sccm.

11. A capacitor array structure, comprising:
    a substrate;
    a capacitor structure, arranged on the substrate; wherein the capacitor structure comprises a bottom electrode layer, a capacitor dielectric layer and a top electrode layer; the capacitor dielectric layer covers a surface of the bottom electrode layer; the top electrode layer covers a surface of the capacitor dielectric layer; and there is gaps formed by the top electrode layer;
    an top electrode conductive layer, comprising a filling layer and a covering layer; wherein the filling layer fills the gaps, the covering layer covers the filling layer and the top electrode layer; a material of both of the covering layer and the filling layer comprises doped polycrystalline silicon; and a volume concentration of doped germanium atoms in the covering layer is greater than a volume concentration of doped germanium atoms in the filling layer.

12. The capacitor array structure according to claim 11, wherein the volume concentration of doped germanium atoms in the covering layer is greater than 30%-50% of the volume concentration of the doped germanium atoms in the filling layer.

13. The capacitor array structure according to claim 11, wherein the volume concentration of doped germanium atoms in the filling layer is 45%-80%, and the volume concentration of doped germanium atoms in the covering layer is 55%-85%.

14. The capacitor array structure according to claim 11, wherein the filling layer fills at least the gaps, and a depth-to-width ratio of the gaps is 20:1-100:1.

15. A semiconductor memory device, comprising a capacitor array structure according to claim 11, wherein the substrate further comprises a transistor; and the capacitor structure is electrically connected to the transistor.

16. A semiconductor memory device, comprising a capacitor array structure according to claim 12, wherein the substrate further comprises a transistor; and the capacitor structure is electrically connected to the transistor.

17. A semiconductor memory device, comprising a capacitor array structure according to claim 13, wherein the substrate further comprises a transistor; and the capacitor structure is electrically connected to the transistor.

18. A semiconductor memory device, comprising a capacitor array structure according to claim 14, wherein the substrate further comprises a transistor; and the capacitor structure is electrically connected to the transistor.

* * * * *